(12) United States Patent
Hamada et al.

(10) Patent No.: US 6,930,393 B2
(45) Date of Patent: Aug. 16, 2005

(54) COMPOSITION FOR FORMING POROUS FILM, POROUS FILM AND METHOD FOR FORMING THE SAME, INTERLAYER INSULATOR FILM, AND SEMICONDUCTOR DEVICE

(75) Inventors: Yoshitaka Hamada, Niigata-ken (JP); Takeshi Asano, Niigata-ken (JP); Hideo Nakagawa, Oumihachiman (JP); Masaru Sasago, Hirakata (JP)

(73) Assignees: Shin-Etsu Chemical Co. Ltd., Tokyo (JP); Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/807,494

(22) Filed: Mar. 23, 2004

(65) Prior Publication Data

US 2004/0195660 A1 Oct. 7, 2004

(30) Foreign Application Priority Data

Mar. 27, 2003 (JP) ......................................... 2003-087068

(51) Int. Cl.[7] ............................................... H01L 21/04
(52) U.S. Cl. .......................................... 257/758; 528/10
(58) Field of Search .............. 528/30–37; 438/778–782, 438/758; 257/632, 635, 642, 750–759

(56) References Cited

U.S. PATENT DOCUMENTS

| | | | |
|---|---|---|---|
| 5,494,859 A | * | 2/1996 | Kapoor ........................ 438/477 |
| 6,197,913 B1 | * | 3/2001 | Zhong .......................... 528/31 |
| 6,313,045 B1 | * | 11/2001 | Zhong et al. ................. 438/758 |
| 6,359,096 B1 | * | 3/2002 | Zhong et al. ................. 528/12 |
| 6,596,404 B1 | * | 7/2003 | Albaugh et al. ............. 428/447 |

FOREIGN PATENT DOCUMENTS

JP   2000-44875   2/2000

OTHER PUBLICATIONS

Inagaki et al., "Synthesis of Highly Ordered Mesoporous Materials from a Layered Polysilicate," 1993, J.Chem. Soc. Chem. Commun., pp. 680–682.*

* cited by examiner

*Primary Examiner*—Leonardo Andújar
(74) *Attorney, Agent, or Firm*—Alston & Bird LLP

(57) ABSTRACT

The object of the invention is to provide a porous film having the dielectric constant of 2.2 or less and having practicable mechanical strength. This invention provides a porous film-forming composition comprising (A) and (B):

(A) 100 parts by weight of a hydrolyzable silicon compound and/or a product resulting from hydrolysis condensation of silicon compound expressed by following formula (1):

$$R^1_a SiZ^1_{4-a} \qquad (1)$$

wherein $Z^1$ denotes a hydrolyzable group; $R^1$ denotes a substituted or non-substituted monovalent hydrocarbon group; and a denotes an integer of 0 to 3; and (B) 0.1 to 20 parts by weight of a cross-linking agent comprising at least one cyclic oligomer which can generate silanol group(s) by heating and which is expressed by following formula (3):

$$\{R^{31}(H)SiO\}_d \{R^{32}(Z^3)SiO\}_e \qquad (3)$$

wherein $R^{31}$ and $R^{32}$ each denotes a substituted or non-substituted monovalent hydrocarbon group; $Z^3$ denotes a group which can generate silanol by heating; and each d and e denotes an integer of 0 to 10, and a sum of d and e is greater than or equal to three.

12 Claims, 1 Drawing Sheet

COMPOSITION FOR FORMING POROUS FILM, POROUS FILM AND METHOD FOR FORMING THE SAME, INTERLAYER INSULATOR FILM, AND SEMICONDUCTOR DEVICE

BACKGROUND OF THE INVENTION

1. Field of the Invention

The present invention relates to a composition for film formation which can be formed into a porous film that excels in dielectric properties, adhesion, film consistency and mechanical strength, and has reduced absorption; a porous film and a method for forming the same; and a semiconductor device which contains the porous film inside.

2. Description of Related Art

In the fabrication of semiconductor integrated circuits, as the circuits are packed tighter, an increase in interconnection capacitance, which is a parasitic capacitance between metal interconnections, leads to an increase in interconnection delay time thereby hindering the enhancement of the performance of semiconductor circuits. The interconnection delay time is called an RC delay, and correlates to the product of the electric resistance of the metal interconnections and the static capacitance between the interconnections. Therefore, reducing the interconnection delay time requires reducing the resistance of metal interconnections or the interconnection capacitance.

The reduction in the interconnection capacitance can prevent a densely packed semiconductor device from causing an interconnection delay, thereby realizing a smaller and faster semiconductor device with reduced power consumption.

One method for reducing interconnection capacitance is to reduce the relative permittivity (dielectric constant) of an interlevel (interlayer) insulator film disposed between metal interconnections. As such an insulator film with a low relative permittivity, it has been considered to use a porous film instead of a silicon oxide film which has been used conventionally. A porous film can be said to be the only practical film as a material with a relative permittivity of 2.2 or less, and various methods for forming a porous film have been proposed.

A first method for forming a porous film is as follows: a precursor solution of a siloxane polymer containing a thermally unstable organic component is synthesized; then the precursor solution is applied on the substrate to form a coating film; and later, a heat treatment is applied to decompose and volatilize the organic component. The resulting film has a number of micro-pores.

As a second method for forming a porous film, it is known to carry out processing by applying a silica sol solution onto a substrate by coating or using a CVD method so as to form a wet gel; then, the silica sol is subjected to a condensation reaction while restricting volume reduction by precisely controlling the speed of the evaporation of the solvent from the wet gel while using solvent exchange method.

As a third method for forming a porous film, it is known that a silica micro-particle solution is applied on a substrate to form a coating film, and then the coating film is sintered to form a number of micro-pores between silica micro-particles.

As a fourth method, Japanese Patent Provisional Publication No. 2000-44875 proposes a composition for porous film formation, which is characterized as containing (A) a component expressed by $(R^1)_n Si(OR^2)_{4-n}$, wherein $R^1$ is a univalent organic radical, and m is an integer of 0 to 2; (B) a metal chelate compound; and (C) a compound having a polyalkylene oxide structure.

However, these methods have respective major drawbacks as follows. In the first method for forming a porous film, the synthesis of the precursor solution of the siloxane polymer increases the cost. In addition, the formation of the coating film by coating the precursor solution increases the amount of silanol groups remaining in the coating film, which causes a degassing phenomenon indicating the evaporation of water and the like in the heat treatment process that is conducted later and which also deteriorates the film quality due to the porous film absorbing humidity.

In the second method for forming a porous film, the speed control of the evaporation of the solvent from the wet gel requires a special type of coating device, which increases the cost. In addition, a significant amount of silanol remains on the surface of the micro-pores which must be changed to silyl group because otherwise hygroscopicity is high and the film quality decreases. The process to change silanol to silyl makes the process more complicated. In the case where a wet gel is formed by the CVD process, it is necessary to use a special type of CVD device which is different from the plasma CVD device generally used in the semiconductor process, thereby also increasing the cost.

In the third method for forming a porous film, the resulting film has the micro-pores having a very large diameter, since defined by the accumulation structure of the silica micro-particles. This makes it difficult to set the relative permittivity of the porous film to 2 or below.

In the case of the fourth method, out of the three components (A), (B) and (C), the metal chelate compound (B) is essential so as to increase the compatibility of the components (A) and (C), and to make the thickness of the coating film uniform after being hardened. However, the addition of compound (B) is not preferable because it makes the manufacturing process complicated and increases the cost. Therefore, it is desired to develop a material which enables a homogeneous solution to be formed without addition of a chelate component and the coating film to be flat after being hardened.

Moreover, the following problems exist in all the above-mentioned methods. Namely, the mechanical strength of the porous film decreases. In order to maintain sufficient mechanical strength of the film, the pore size should be minute and uniform, and the hole should be distributed uniformly in the membrane.

On the other hand, it is also necessary to decrease the process temperature in order to maintain the stability of the wiring material, and the material is desired which can be completely hardened at a temperature below 450° C., preferably 400° C., and exhibit adequate mechanical strength. Such a material is desired as those which make it possible to form multilayer interconnection at a temperature below the melting point of aluminum, which is used as a wiring material, which prevent copper from being oxidized.

As mentioned above the related materials have several problems: the decrease of the quality of the film during the heat treatment process, and increase of the cost. Moreover, there is a problem of poor characteristics of spreading when the porous film is formed. Furthermore there is a problem that adequate mechanical strength may not be obtained when the related porous film is incorporated as a insulating layer into a multilayer interconnection.

As above there is a problem that the large dielectric constant of the porous film used as an insulator film in the multilayer interconnection of the semiconductor device makes the RC delay in the multilayer interconnection of the semiconductor device increased, and makes it impossible for the performance of the semiconductor device (high speed and low power consumption) to be improved. Furthermore, a porous film with a low mechanical strength deteriorates the reliability of the semiconductor device.

SUMMARY OF THE INVENTION

The object of this invention is to overcome the above-mentioned various problems to provide a porous film-forming composition which makes the production of the porous film having dielectric constant 2.2 or less and having sufficient mechanical strength with simple process and with low cost, a method for forming porous film, and porous film. The present invention has another object to provide a high-performance and highly reliable semiconductor device which comprises the porous film inside.

The invention provides a porous film-forming composition comprising (A) and (B):

(A) 100 parts by weight of at least one hydrolyzable silicon compound and/or at least one product resulting from at least partial hydrolysis condensation of the silicon compound selected from the group consisting of compounds expressed by following formulae (1) and (2):

$$R^1{}_a SiZ^1{}_{4-a} \qquad (1)$$

wherein $Z^1$ denotes independently a hydrolyzable group, and when the compound (1) includes plurality of $Z^1$s, the $Z^1$s may be identical or different; $R^1$ denotes independently a substituted or non-substituted monovalent hydrocarbon group, and when the compound (1) includes plurality of $R^1$s, the $R^1$s may be identical or different; and a is an integer of 0 to 3; and $$R^{21}{}_b(Z^{21})_{3-b}Si\text{—}Y\text{—}Si(R^{22})_c Z^{22}{}_{3-c} \qquad (2)$$

wherein $Z^{21}$ and $Z^{22}$ each denotes independently a hydrolyzable group, and when the compound (2) includes plurality of $Z^{21}$s and/or $Z^{22}$s, the $Z^{21}$s and/or $Z^{22}$s may be identical or different; $R^{21}$ and $R^{22}$ each denotes independently a substituted or non-substituted monovalent hydrocarbon group, and when the compound (2) includes plurality of $R^{21}$s and/or $R^{22}$s, the $R^{21}$s and/or $R^{22}$s may be identical or different; each of b and c denotes independently an integer of 0 to 2; and Y is an oxygen atom, a phenylene group, or a divalent hydrocarbon group; and (B) 0.1 to 20 parts by weight of a cross-linking agent comprising at least one cyclic or multiple-branched oligomer which can generate one or more silanol groups by heating and which is selected from the group consisting of oligomers expressed by following formulae (3) to (8), wherein the oligomers:

$$\{R^{31}(H)SiO\}_d\{R^{32}(Z^3)SiO\}_e \qquad (3)$$

wherein $R^{31}$ and $R^{32}$ each denotes independently a substituted or non-substituted monovalent hydrocarbon group, and when the compound (3) includes plurality of $R^{31}$s and/or $R^{32}$s, the $R^{31}$s and/or $R^{32}$s may be identical or different; $Z^3$ denotes independently a group which can generate silanol by heating, and when the compound (3) includes plurality of $Z^3$s, the $Z^3$s may be identical or different; and each d and e denotes independently an integer of 0 to 10, and a sum of d and e is greater than or equal to three;

$$(R^{41}SiO_{3/2})_f\{R^{42}(H)SiO\}_g\{R^{43}(Z^4)SiO\}_h \qquad (4)$$

wherein $R^{41}$, $R^{42}$ and $R^{43}$ each denotes independently a substituted or non-substituted monovalent hydrocarbon group, and when the compound (4) includes plurality of $R^{41}$s, $R^{42}$s and/or $R^{43}$s, the $R^{41}$s, $R^{42}$s and/or $R^{43}$s may be identical or different; $Z^4$ denotes independently a group which can generate silanol by heating, and when the compound (4) includes plurality of $Z^4$s, the $Z^4$s may be identical or different; and each f, g and h denotes independently an integer from 0 to 10, a sum of f, g and b is greater than or equal to four, and f is an even number;

$$(HSiO_{3/2})_i(Z^5 SiO_{3/2})_j \qquad (5)$$

wherein $Z^5$ denotes independently a group which can generate silanol by heating, and when the compound (5) includes plurality of $Z^5$s, the $Z^5$s may be identical or different; and each i and j denotes independently an integer from 0 to 10, a sum of i and j is greater than or equal to four, and a sum of i and j is an even number;

$$\{H(CH_3)_2SiO_{1/2}\}_k\{Z^{61}(CH_3)_2SiO_{1/2}\}_m(R^{61}SiO_{3/2})_n\{R^{62}(Z^{62})SiO\}_p \qquad (6)$$

wherein $R^{61}$ and $R^{62}$ each denotes independently a substituted or non-substituted monovalent hydrocarbon group, and when the compound (6) includes plurality of $R^{61}$s and/or $R^{62}$s, the $R^{61}$s and/or $R^{62}$s may be identical or different; $Z^{61}$ and $Z^{62}$ each denotes independently a group which can generate silanol by heating, and when the compound (6) includes plurality of $Z^{61}$s and/or $Z^{62}$s, the $Z^{61}$s and/or $Z^{62}$s may be identical or different; and each k, m, n and p denotes independently an integer from 0 to 20, a sum of k, m, n and p is greater than or equal to five, and a sum of k, m and n is an even number;

$$\{H(CH_3)_2SiO_{1/2}\}_q\{Z^{71}(CH_3)_2SiO_{1/2}\}_r(SiO_2)_s(Z^{72}SiO_{3/2})_t \qquad (7)$$

wherein $Z^{71}$ and $Z^{72}$ each denotes independently a group which can generate silanol by heating, and when the compound (7) includes plurality of $Z^{71}$s and/or $Z^{72}$s, the $Z^{71}$s and/or $Z^{72}$s may be identical or different; and each q, r, s and t denotes independently an integer from 0 to 20, a sum of q, r, s and t is greater than or equal to four, and a sum of q, r and t is an even numbers; and $$(Z^{81}{}_3SiO_{1/2})_u(R^{81}{}_2SiO)_v(R^{82}SiO_{3/2})_w\{R^{83}(Z^{82})SiO\}_x(SiO_2)_y(Z^{83}SiO_{3/2})_z \qquad (8)$$

wherein $R^{81}$, $R^{82}$ and $R^{83}$ each denotes independently a substituted or non-substituted monovalent hydrocarbon group, and when the compound (8) includes plurality of $R^{81}$s, $R^{82}$s and/or $R^{83}$s, the $R^{81}$s, $R^{82}$s and/or $R^{83}$s may be identical or different; each $Z^{81}$, $Z^{82}$ and $Z^{83}$ denotes independently a group which can generate silanol by heating, and when the compound (8) includes plurality of $Z^{81}$s, $Z^{82}$s and/or $Z^{83}$s, the $Z^{81}$s, $Z^{82}$s and/or $Z^{83}$s may be identical or different; and each u, v, w, x, y and z denotes independently an integer from 0 to 20, a sum of u, v, w, x, y and z is greater than or equal to three, and a sum of u, w and z is an even number.

Another aspect of the invention provides a method for forming a porous film, comprising the steps of: applying the above-mentioned composition to a substrate to form a film thereon; applying a $1^{st}$ thermal processing to the film at temperature adequate to volatilize the solvent in the film; and subsequently applying a $2^{nd}$ thermal processing to the film.

Moreover, another aspect of the invention provides a porous film obtainable by using the abovementioned method.

Another aspect of the invention provides a semiconductor device comprising an internal porous film obtainable by using a porous film-forming composition comprising (A) and (B):

(A) 100 parts by weight of at least one hydrolyzable silicon compound and/or at least one product resulting from at least partial hydrolysis condensation of the silicon compound selected from the group consisting of compounds expressed by following formulae (1) and (2):

$$R^1{}_a SiZ^1{}_{4-a} \tag{1}$$

wherein $Z^1$ denotes independently a hydrolyzable group, and when the compound (1) includes plurality of $Z^1$s, the $Z^1$s may be identical or different; $R^1$ denotes independently a substituted or non-substituted monovalent hydrocarbon group, and when the compound (1) includes plurality of $R^1$s, the $R^1$s may be identical or different; and a is an integer of 0 to 3; and $$R^{21}{}_b(Z^{21})_{3-b}Si-Y-Si(R^{22})_c Z^{22}{}_{3-c} \tag{2}$$

wherein $Z^{21}$ and $Z^{22}$ each denotes independently a hydrolyzable group, and when the compound (2) includes plurality of $Z^{21}$s and/or $Z^{22}$s, the $Z^{21}$s and/or $Z^{22}$s may be identical or different; $R^{21}$ and $R^{22}$ each denotes independently a substituted or non-substituted monovalent hydrocarbon group, and when the compound (2) includes plurality of $R^{21}$s and/or $R^{22}$s the $R^{21}$s and/or $R^{22}$s may be identical or different ; each of b and c denotes independently an integer of 0 to 2; and Y is an oxygen atom, a phenylene group, or a divalent hydrocarbon group; and (B) 0.1 to 20 parts by weight of a cross-linking agent comprising at least one cyclic or multiple-branched oligomer which can generate one or more silanol groups by heating and which is selected from the group consisting of oligomers expressed by following formulae (3) to (8), wherein the oligomers:

$$\{R^{31}(H)SiO\}_d \{R^{32}(Z^3)SiO\}_e \tag{3}$$

wherein $R^{31}$ and $R^{32}$ each denotes independently a substituted or non-substituted monovalent hydrocarbon group, and when the compound (3) includes plurality of $R^{31}$s and/or $R^{32}$s, the $R^{31}$s and/or $R^{32}$s may be identical or different; $Z^3$ denotes independently a group which can generate silanol by heating, and when the compound (3) includes plurality of $Z^3$s, the $Z^3$s may be identical or different; and each d and e denotes independently an integer of 0 to 10, and a sum of d and e is greater than or equal to three;

$$(R^{41}SiO_{3/2})_f \{R^{42}(H)SiO\}_g \{R^{43}(Z^4)SiO\}_h \tag{4}$$

wherein $R^{41}$, $R^{42}$ and $R^{43}$ each denotes independently a substituted or non-substituted monovalent hydrocarbon group, and when the compound (4) includes plurality of $R^{41}$s, $R^{42}$s and/or $R^{43}$s , the $R^{41}$s, $R^{42}$s and/or $R^{43}$s may be identical or different; $Z^4$ denotes independently a group which can generate silanol by heating, and when the compound (4) includes plurality of $Z^4$s, the $Z^4$s may be identical or different; and each f, g and h denotes independently an integer from 0 to 10, a sum of f, g and b is greater than or equal to four, and f is an even number;

$$(HSiO_{3/2})_i (Z^5 SiO_{3/2})_j \tag{5}$$

wherein $Z^5$ denotes independently a group which can generate silanol by heating, and when the compound (5) includes plurality of $Z^5$s, the $Z^5$s may be identical or different; and each i and j denotes independently an integer from 0 to 10, a sum of i and j is greater than or equal to four, and a sum of i and j is an even number;

$$\{H(CH_3)_2 SiO_{1/2}\}_k \{Z^{61}(CH_3)_2 SiO_{1/2}\}_m (R^{61}SiO_{3/2})_n \{R^{62}(Z^{62})SiO\}_p \tag{6}$$

wherein $R^{61}$ and $R^{62}$ each denotes independently a substituted or non-substituted monovalent hydrocarbon group, and when the compound (6) includes plurality of $R^{61}$s and/or $R^{62}$s, the $R^{61}$s and/or $R^{62}$s may be identical or different; $Z^{61}$ and $Z^{62}$ each denotes independently a group which can generate silanol by heating, and when the compound (6) includes plurality of $Z^{61}$s and/or $Z^{62}$s, the $Z^{61}$s and/or $Z^{62}$s may be identical or different; and each k, m, n and p denotes independently an integer from 0 to 20, a sum of k, m, n and p is greater than or equal to five, and a sum of k, m and n is an even number;

$$\{H(CH_3)_2 SiO_{1/2}\}_q \{Z^{71}(CH_3)_2 SiO_{1/2}\}_r (SiO_2)_s (Z^{72}SiO_{3/2})_t \tag{7}$$

wherein $Z^{71}$ and $Z^{72}$ each denotes independently a group which can generate silanol by heating, and when the compound (7) includes plurality of $Z^{71}$s and/or $Z^{72}$s, the $Z^{71}$s and/or $Z^{72}$s may be identical or different; and each q, r, s and t denotes independently an integer from 0 to 20, a sum of q, r, s and t is greater than or equal to four, and a sum of q, r and t is an even numbers; and $$(Z^{81}{}_3 SiO_{1/2})_u (R^{81}{}_2 SiO)_v (R^{82}SiO_{3/2})_w \{R^{83}(Z^{82})SiO\}_x (SiO_2)_y (Z^{83}SiO_{3/2})_z \tag{8}$$

wherein $R^{81}$, $R^{82}$ and $R^{83}$ each denotes independently a substituted or non-substituted monovalent hydrocarbon group, and when the compound (8) includes plurality of $R^{81}$s, $R^{82}$s and/or $R^{83}$s, the $R^{81}$s, $R^{82}$s and/or $R^{83}$s may be identical or different; each $Z^{81}$, $Z^{82}$ and $Z^{83}$ denotes independently a group which can generate silanol by heating, and when the compound (8) includes plurality of $Z^{81}$s, $Z^{82}$s and/or $Z^{83}$s, the $Z^{81}$s, $Z^{82}$s and/or $Z^{83}$s may be identical or different; and each u, v, w, x, y and z denotes independently an integer from 0 to 20, a sum of u, v, w, x, y and z is greater than or equal to three, and a sum of u, w and z is an even number.

Specifically, the abovementioned porous film is used as an insulator film in a multilayer interconnection in the semiconductor device.

The semiconductor device comprising inside an insulator film that has a low dielectric constant is achieved due to the decrease of the hygroscopic property of the porous film, in addition with maintaining the mechanical strength of the semiconductor device. Due to the decrease of the dielectric constant of the insulator film, the parasitic capacitance of the area around the multilayer interconnection is decreased, leading to the high-speed operation and low power consumption of the semiconductor device.

Moreover, it is preferable that the porous film is between metal interconnections in a same layer of multi-level interconnects, or is between upper and lower metal interconnection layers. This results in a high-performance and highly reliable semiconductor device.

As detailed below, the storage stability and low-temperature curing property of the composition of this invention are excellent. The composition makes it possible to form suitable film as an interlevel insulating film of the semiconductor device, which is porous, smooth, uniform, and have low dielectric constant and a high mechanical strength. In addition, the use of the porous film obtained by using the composition of the present invention as the insulator film of the multilayered interconnections provides a high-performance and highly reliable semiconductor device.

DETAILED DESCRIPTION OF PREFERRED EMBODIMENTS

Figure 1:
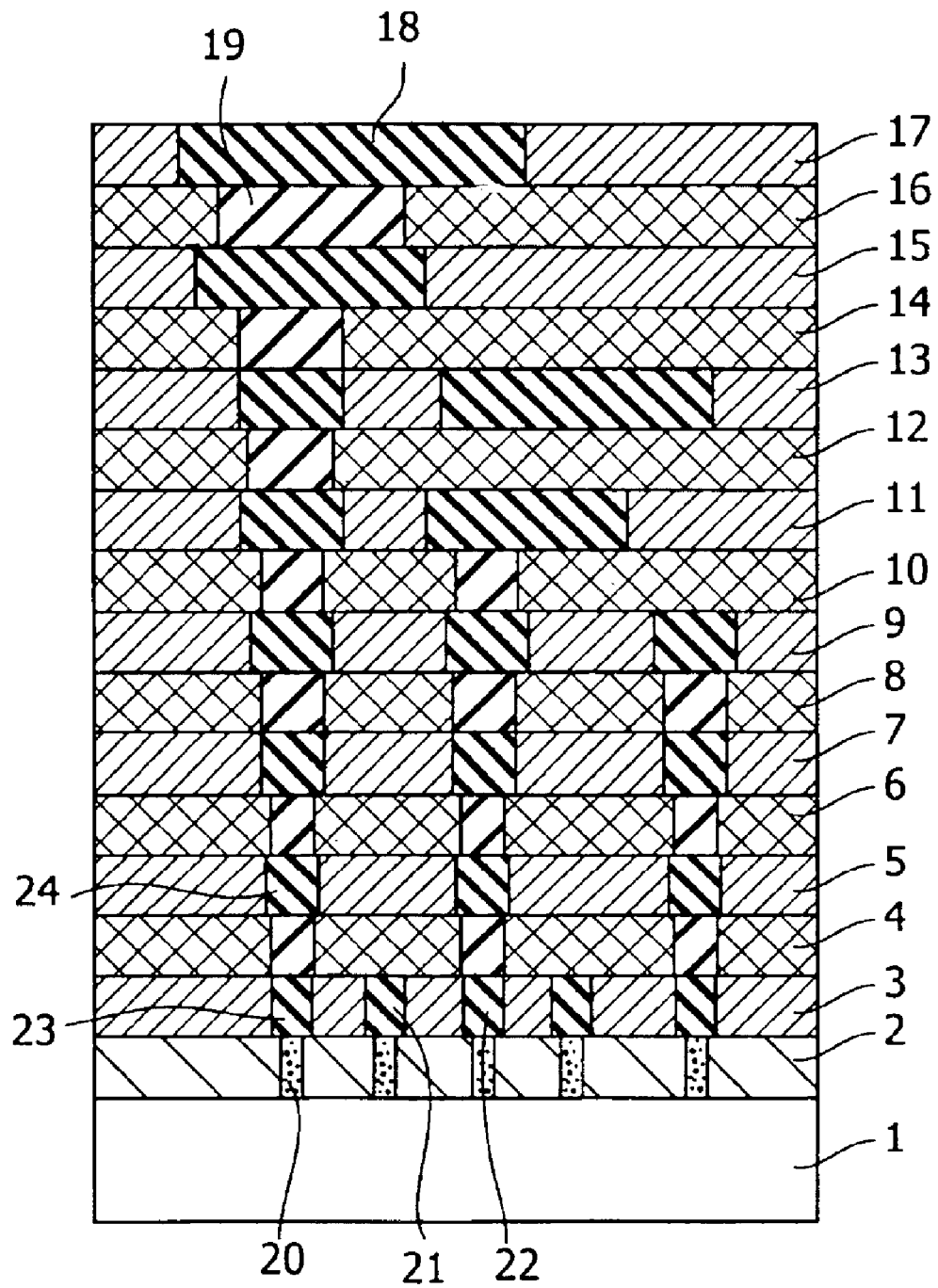
FIG. 1 shows a schematic cross-sectional view of a semiconductor device of the present invention.

The embodiment of this invention is described as follows. This invention is not limited to the following embodiment.

This invention provides a film-forming composition for forming silica film, comprising (A) and (B):

(A) 100 parts by weight of at least one hydrolyzable silicon compound and/or at least one product resulting from at least partial hydrolysis condensation of the silicon compound selected from the group consisting of compounds expressed by following formulae (1) and (2):

(B) 0.1 to 20 parts by weight of a cross-linking agent comprising at least one cyclic or multiple-branched oligomer which can generate one or more silanol groups by heating and which is selected from the group consisting of oligomers expressed by following formulae (3) to (8), wherein the oligomers.

In the above compounds (1) to (8), $R^1$, $R^{21}$, $R^{22}$, $R^{31}$, $R^{32}$, $R^{41}$, $R^{42}$, $R^{43}$, $R^{61}$, $R^{62}$, $R^{81}$, $R^{82}$ and $R^{83}$ each denotes independently a substituted or non-substituted monovalent hydrocarbon group, and preferably has the number of carbon atoms of 1 to 12. These groups include, but not limited to, alkyl group, aryl group, aralkyl radical, alkenyl group, epoxy group-containing alkyl group, and amino group-containing alkyl group. A part or all of the hydrogen atoms of the group may be substituted by one or more halogen atoms. More preferably, the number of carbon atoms is 1 to 6 and the group is methyl group, ethyl group, propyl group, and phenyl group, and the like.

In the above compound (2), Y denotes an oxygen atom, a phenylene group, or a divalent hydrocarbon group. Among a phenylene group and divalent hydrocarbon group, preferably Y denotes divalent aliphatic hydrocarbon group having the number of carbon atom of 1 to 6, which may be a straight chain, divergent, or cyclic structure and may be saturated or unsaturated; or divalent aromatic hydrocarbon group having the number of carbon atom of 6 to 12, which may be a monocycle, condensation multiple ring, bridge ring, or ring set type.

In the above compounds (1) and (2), $Z^1$, $Z^{21}$ and $Z^{22}$ each denotes independently a hydrolyzable group, and preferably includes, but not limited to, a halogen atom, an alkoxy group, an acyloxy group, an oxime group and an amino group. The alkoxy group with a carbon number of 1 to 6 is desirable as the hydrolyzable group. More preferably, these groups are methoxy group, ethoxy group and isopropoxy group, since it is easy to control their hydrolysis and condensation reactions.

In the above compounds (3) to (8), $Z^3$, $Z^4$, $Z^5$, $Z^{61}$, $Z^{62}$, $Z^{71}$, $Z^{72}$, $Z^{81}$, $Z^{82}$ and $Z^{83}$ each denotes independently a group which can generate silanol by heating, and preferably includes a methoxy group, an ethoxy group, a propoxy group, an isopropoxy group, an iso-butoxy group, a sec-butoxy group, a tert-butoxy group, and a neopentoxy group.

Preferably, the group which can generate silanol by heating has the decomposition temperature of 350° C. or less (more preferably 200 to 350° C.), and includes, but not limited to isopropoxy group, iso-butoxy group, sec-butoxy group, tert-butoxy group, and neopentoxy group.

More preferably, the group which can generate silanol by heating is a secondary alkoxy group or third alkoxy group, and includes isopropoxy group, sec-butoxy group, and tert-butoxy group. In this context, "a primary amino alkoxy group" refers to a group in which an oxygen atom unites with a primary carbon atom ($RCH_2O$—), "a secondary alkoxy group" refers to a group in which an oxygen atom unites with a secondary carbon atom ($RCH(R')O$—), and "a tertiary class alkoxy group" refers to a group in which an oxygen atom unites with a tertiary carbon atom ($RC(R')(R'')O$—). It is considered that the radical generated by pyrolysis of these groups are stable and that these groups tend to form silanol with the emission of hydrogen, and themselves exist in the form of olefin.

As the above compound (1), desirable examples are as follows: trichlorosilane, trimethoxysilane, triethoxysilane, tripropoxysilane, methyl trichlorosilane, methyltrimethoxysilane, methyltriethoxysilane, methyltripropoxysilane, ethyltrichlorosilane, ethyltrimethoxysilane, ethyltriethoxysilane, ethyltripropoxysilane, propyltrichlorosilane, propyltrimethoxysilane, propyltriethoxysilane, propyltripropoxysilane, phenyltrichlorosilane, phenyltrimethoxysilane, phenyltriethoxysilane, tetramethoxysilane, tetraethoxysilane, tetrapropoxysilane, dimethylsilane, dimethylchlorosilane, dimethyldichlorosilane, and dimethylmethoxysilane, dimethylethoxysilane, dimethylpropoxysilane, dimethyldimethoxysilane, dimethyldiethoxysilane, dimethyldipropoxysilane, diethylsilane, diethylchlorosilane, diethyldichlorosilane diethylmethoxysilane, diethylethoxysilane, diethylpropoxysilane, diethyldimethoxysilane, diethyldiethoxysilane, diethyldipropoxysilane, propylsilane, dipropylchlorosilane, dipropyldichlorosilane, dipropylmethoxysilane, dipropyl ethoxysilane, dipropylpropoxysilane, dipropyldimethoxysilane, dipropyldiethoxysilane, dipropyldipropoxysilane, diphenylsilane, diphenylchlorosilane, diphenyldichlorosilane, diphenylmethoxysilane, diphenylethoxysilane, diphenylpropoxysilane, diphenyldimethoxysilane, diphenyldiethoxysilane, and diphenyldipropoxysilane.

As the above compound (2), desirable examples include bis(trimethoxysilyl)methane, bis(triethoxysilyl)methane, bis(methyldimethoxysilyl)methane, bis(methyldiethoxysilyl)methane, bis(dimethoxysilyl)methane, bis(diethoxysilyl)methane, bis(dimethylsilyl)methane, bis(dimethylmethoxysilyl)methane, bis(dimethylethoxysilyl)methane, bis-1,2-(trimethoxysilyl)ethane, bis-1,2-(triethoxysilyl)ethane, bis-1,2-(methyldimethoxysilyl)ethane, bis-1,2-(methyldiethoxysilyl)ethane, bis-1,2-(methylmethoxysilyl)ethane, bis-1,2-(methylethoxysilyl)ethane, bis-1,2-(dimethoxysilyl)ethane, bis-1,2-(diethoxysilyl)ethane, bis-1,2-(dimethylsilyl)ethane, bis-1,2-(dimethylmethoxysilyl)ethane, bis-1,2-(dimethylethoxysilyl)ethane, bis-1,6-(trimethoxysilyl)hexane, bis-1,6-(triethoxysilyl)hexane, bis-1,6-(methyldimethoxysilyl)hexane, bis-1,6-(methyldiethoxysilyl)hexane, bis-1,6-(methylmethoxysilyl)hexane, bis-1,6-(methylethoxysilyl)hexane, bis-1,6-(dimethoxysilyl)hexane, bis-1,6-(diethoxysilyl)hexane, bis-1,6-(dimethylsilyl)hexane, bis-1,6-(dimethylmethoxysilyl)

hexane, bis-1,6-(dimethylethoxysilyl)hexane, bis-1,4-(trimethoxysilyl)benzene, bis-1,4-(triethoxysilyl)benzene, bis-1,4-(methyldimethoxysilyl)benzene, bis-1,4-(methyldiethoxysilyl)benzene, bis-1,4-(methylmethoxysilyl)benzene, bis-1,4-(methylethoxysilyl)benzene, bis-1,4-(dimethoxysilyl)benzene, bis-1,4-(diethoxysilyl)benzene, bis-1,4-(dimethylsilyl)benzene, bis-1,4-(dimethylmethoxysilyl)benzene, and bis-1,4-(dimethylethoxysilyl)benzene.

As the above compound (3), desirable examples are shown in (3-1) below. It may preferably include 1,3,5,7-tetramethyl-1,3,5,7-tetra-sec-butoxycyclotetrasiloxane, 1,3,5,7-tetramethyl-1,3,5,7-tetraethoxyyclotetrasiloxane, and 1,3,5,7-tetramethyl-1,3,5,7-tetra-tert-butoxycyclotetrasiloxane.

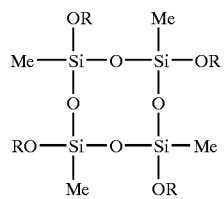

(3-1)

As the above compound (4), desirable examples are shown in (4-1) below. It may preferably include the compounds formed by the partial condensation of the alkoxy group of above compound (3) and thereby having the siloxane linkage, such as 2,4,7,9,11,13-hexamethyl-2,4,7,9-tetramethoxy-2,4,7,9,11,13-hexasilabicyclo[5,5,1]-siloxane.

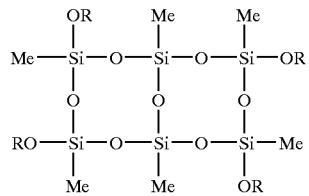

(4-1)

As the above compound (5), desirable examples are shown in (5-1) below.

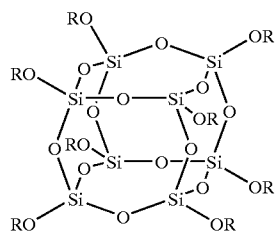

(5-1)

As the above compound (6), desirable examples are shown in (6-1) below. It may preferably include tris(dimethylmethoxysiloxy)methylsilane, tris(dimethyl-sec-butoxysiloxy)-methylsilane, 1,1,3,3-tetrakis(dimethylmethoxysiloxy)-1,3-dimethylsiloxane, and 1,1,3,3-tetrakis(dimethyl-sec-butoxysiloxy)-1,3-dimethylsiloxane.

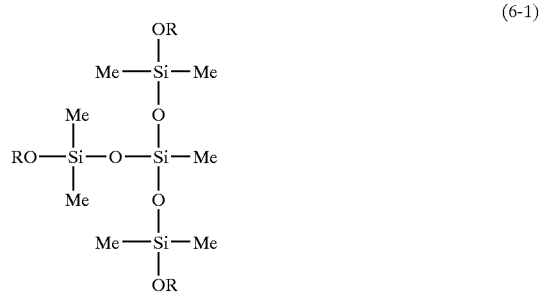

(6-1)

As the above compound (7), desirable examples are shown in (7-1) below. It may preferably include tetrakis(dimethylmethoxysiloxy)silane, tetrakis(dimethyl-sec-butoxysiloxy)silane, and hexakis(dimethylmethoxysiloxy)disiloxane.

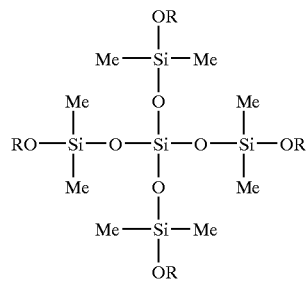

(7-1)

As the above compound (8), desirable examples are shown in (8-1) below. It may preferably include the compounds formed by combining the above compounds (7) and the above compounds (6), and the compounds having the siloxane chain introduced thereto.

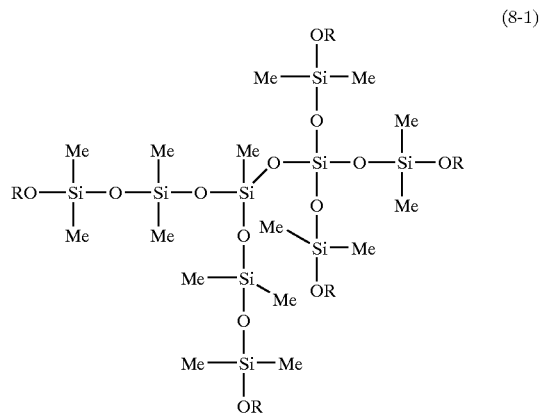

(8-1)

The Me in compounds of (3-1) to (8-1) represents $CH_3$. The R represents a monovalent hydrocarbon group that may or may not be substituted.

The above compounds (1) or (2) are commercially available. Alternatively, those compounds can be synthesized using various methods.

The above compound (3) is commercially available. Alternatively, the compound can be synthesized using various methods such as the reaction method of the following formula (3-2). At this time, it is desirable that basic catalyst (base) is used.

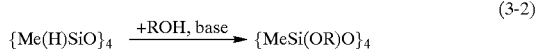

$$\{Me(H)SiO\}_4 \xrightarrow{+ROH, \text{ base}} \{MeSi(OR)O\}_4 \quad (3\text{-}2)$$

The above compound (4) is commercially available. Alternatively, the compound can be synthesized by various methods such as by the reaction method of the following formula (4-2). In this reaction, such compounds can be synthesized by condensation by the siloxane linkage at part of the alkoxy group of above compound (3). In this case, a lesser amount of water should be added.

$$\{MeSi(OR)O\}_4 \xrightarrow{+H_2O} \quad (4\text{-}2)$$

The above compound (5) is commercially available. Alternatively, the compound can be synthesized using various methods such as by the reaction method of the following formula (5-2). At this time, it is desirable that the basic catalyst is used.

$$(HSiO_{3/2})_8 \xrightarrow{+ROH, \text{ base}} (ROSiO_{3/2})_8 \quad (5\text{-}2)$$

The above compound (6) is commercially available. Alternatively, the compounds can be synthesized using a variety of methods such as by the reaction method of the following formula (6-2). At this time, it is desirable that the basic catalyst is used.

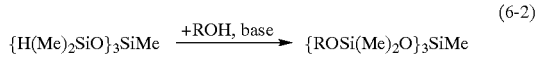

$$\{H(Me)_2SiO\}_3SiMe \xrightarrow{+ROH, \text{ base}} \{ROSi(Me)_2O\}_3SiMe \quad (6\text{-}2)$$

The above compound (7) is commercially available. Alternatively, the compounds can be synthesized using various methods such as by the reaction method of the following formula (7-2). At this time, it is desirable that the basic catalyst is used.

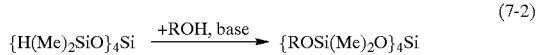

$$\{H(Me)_2SiO\}_4Si \xrightarrow{+ROH, \text{ base}} \{ROSi(Me)_2O\}_4Si \quad (7\text{-}2)$$

The above compound (8) is commercially available. Alternatively, the compounds can be synthesized using various methods such as by the reaction method of the following formula (8-2). In this reaction, such compounds can be synthesized by condensation by the siloxane linkage at part of the alkoxy group of above compound (7) and part of the alkoxy group of above compound (7). In this case, a lesser amount of water should be added.

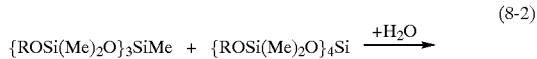

$$\{ROSi(Me)_2O\}_3SiMe + \{ROSi(Me)_2O\}_4Si \xrightarrow{+H_2O} \quad (8\text{-}2)$$

In above formulae (3-2) to (8-2), the Me refers to $CH_3$, and R independently refers to a substituted or non-substituted monovalent hydrocarbon group. In the film-forming composition for forming silica film in this invention, the hydrolyzable silicon compound shown in the above compound (1) or (2) may be used by itself, or as a mixture of the compounds. Compounds resulting from partial hydrolysis condensation thereof also can be used.

When the partially hydrolysis condensation product is used, the following are desirable as the condition of hydrolysis condensation; the amount of water added for hydrolysis is preferably 0.5 to 10 times the amount necessary for complete the hydrolysis of the hydrolyzable silicon compound. When less water than this is used, the molecular weight of the condensation product may not increase sufficiently, and the volatility of the product material may be high. When more water than this is used, the molecular weight of the condensation product may be excessive and the product material may not solve to solvent, or the storage stability decreases. Moreover, it is desirable that the basic catalyst is added. The amount of the basic catalyst is preferably 0.001 to 0.1 moles per 1 mole hydrolyzable silicon compound. The basic catalysts can include amines such as ammonia, methylamine, ethylamine, propylamine, diisopropylamine, triethylamine, and triethanolamine; ammonium hydroxide salts such as tetramethylammonium hydroxide, benzyltrimethylammonium hydroxide, dodecyltrimethylammonium hydroxide, tetradecyltrimethylammonium hydroxide, hexadecyltrimethylammonium hydroxide, octadecyltrimethylammonium hydroxide, tetraethylammonium hydroxide, tetrapropylammonium hydroxide, and tetrabutylammonium hydroxide; alkali metal hydroxides or alkaline earth metal hydroxides such as sodium hydroxide, potassium hydroxide, calcium hydroxide, and barium hydroxide. In addition, a so-called anion-exchange resin can be used, which contains substitutes with the polystyrene skelton, the substitute being quaternary ammonium ion, tertiary amine, secondary amine, or primary amine. Ammonia or organic amine is desirable as the alkali, which may be used by itself or as a mixture thereof.

The organic solvent may be used during hydrolysis and condensation to keep the polymer stable. The amount of the solvent is preferably 3 to 100 g per 1 g hydrolyzable silicon compound. When the amount of organic solvent is less than 3 g, the hydrolyzable silicon compound may not be dissolved sufficiently, and the reaction may not be uniform. When the amount of organic solvent is more than 100 g, the reaction may not be practicable, for instance, a big container may be necessary for the reaction. The organic solvent includes, but not limited to, alcohols with a carbon number of 6 or less, ethylene oxide-typed glycol ethers, propylene oxide-typed glycol ethers, and dialkyl glycol ethers. The organic solvent having compatibility with water may be desirable. Such organic solvent can include alcohols such as methanol, ethanol, propanol, isopropanol, butanol, and isobutanol; ether solvents such as dioxolane, 4-methyldioxolane, dioxane, dimethyldioxane, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, and diethylene glycol monomethyl ether, diethylene glycol dimethyl ether, diethylene glycol monoethyl ether, diethylene glycol diethyl ether, diethylene glycol monopropyl ether, diethylene glycol dipropyl ether, and diethylene glycol monobutyl ether, diethylene glycol dibutyl ether, tetrahydrofuran, 2-methyltetrahydrofuran, propylene glycol monomethyl ether, propylene glycol dimethyl ether, propylene glycol monoethyl ether, propylene glycol diethyl ether, propylene glycol monopropyl ether, propylene glycol dipropyl ether, propylene glycol monobutyl ether, dipropylene glycol dimethyl ether, dipropylene glycol diethyl ether, dipropylene glycol dipropyl ether, and dipropylene glycol dibutyl ether; ester solvents such as ethyl acetoacetate ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, dipropylene glycol monomethyl ether acetate, dipropylene glycol monoethyl ether acetate, dipropylene glycol mono-n-butyl ether acetate, glycol diacetate, and methoxy triglycol acetate; nitrogen-containing solvent such as N-methylformamide, N,N-dimethylformamide, acetamide, N-methylacetamide, N,N-dimethylacetamide N-methylpropionamido, and N-methylpyrrolidone; sulfur-containing solvent such as thiophene, tetrahydrothiophene, dimethylsulfoxide, sulfolane, and 1,3-propanesultone. These solvent can be used by itself or a mixture thereof.

Preferably, the solvent for hydrolysis, alcohol generated by hydrolysis, water, and the like are substituted with the solvent for coating by distillation under low pressure atmosphere, with devices such as rotary evaporators or evaporators. It is desirable to provide solution containing a suitable amount of solid non-volatile ingredient, optionally adding organic solvent for the coating, if necessary, as detailed below.

The cross-linking agent in this invention comprises at least one cyclic or multiple-branched oligomer expressed by formulae (3) to (8). The addition of the cross-linking agent to the film-forming composition for forming silica film improves the mechanical strength after hardening.

The amount of the cross-linking agent is preferably 0.1 to 20 parts, more preferably 1 to 10 parts by weight per 100 parts by weight of the abovementioned hydrolyzable silicon compound or the partly hydrolyzed condensation product thereof. When the amount of cross-linking agent is less than this, mechanical strength may be insufficient. When the amount of cross-linking agent is more than this, the structure of porosity may be destroyed, and the dielectric constant rises.

The film-forming composition for forming silica film of this invention comprising the abovementioned (A) and (B) preferably further comprises organic solvent. The amount of this organic solvent is not specifically limited, but in view of the coating, the solution comprising 5 to 20 wt % of non-volatile matter (NV) is preferred. When the NV is less than this, suitable film thickness may not be obtained in the coating. When the NV is more than this, the coating film may not be uniform. The organic solvent is not specifically limited, unless the solution of the film-forming composition for forming silica film can keep uniformity as solution. Preferred solvents can include aliphatic hydrocarbon solvents such as n-pentane, i-pentane, n-hexane, i-hexane, n-heptane, 2,2,2-trimethylpentane, n-octane, i-octane, cyclohexane and methylcyclohexane; aromatic hydrocarbon solvents such as benzene, toluene, xylene, ethylbenzene, trimethylbenzene, methylethylbenzene, n-propylbenzene, i-propylbenzene, o-diethylbenzene, i-butylbenzene, triethylbenzene, di-i-propylbenzene, and n-amylnaphthalene; ketone solvents such as acetone, methyl ethyl ketone, methyl n-propyl ketone, methyl n-butyl ketone, methyl i-butyl ketone, trimathylnonanone, cyclohexanone, 2-hexanone, methylcyclohexanone, 2,4-pentanedione, acetonylacetone, diacetone alcohol, acetophenone, and fenthion; ether solvents such as ethyl ether, i-propyl ether, n-butyl ether, n-hexyl ether, 2-ethyl hexyl ether, dioxolane, 4-methyldioxolane, dioxane, dimethyldioxane, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol dimethyl ether, diethylene glycol monoethyl ether, diethylene glycol diethyl ether, diethylene glycol monopropyl ether, diethylene glycol dipropyl ether, diethylene glycol monobutyl ether, diethylene glycol dibutyl ether, tetrahydrofuran, 2-methyltetrahydrofuran, propylene glycol monomethyl ether, propylene glycol dimethyl ether, propylene glycol monoethyl ether, propylene glycol diethyl ether, propylene glycol monopropyl ether, propylene glycol dipropyl ether, propylene glycol monobutyl ether, dipropylene glycol dimethyl ether, dipropylene glycol diethyl ether, dipropylene glycol dipropyl ether, and dipropylene glycol dibutyl ether; ester solvents such as diethylcarbonate, ethyl acetate, gamma-butyrolactone, gamma-valerolactone, n-propyl acetate, i-propyl acetate, n-butyl acetate, i-butyl acetate, sec-butyl acetate, n-pentyl acetate, 3-methoxybutyl acetate, methyl pentyl acetate, 2-ethylbutyl acetate, 2-ethylhexyl acetate, benzyl acetate, cyclohexyl acetate, methyl cyclohexyl acetate, n-nonyl acetate, methyl acetoacetate, ethyl acetoacetate, and ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, dipropylene glycol monomethyl ether acetate, dipropylene glycol monoethyl ether acetate, dipropylene glycol mono-n-butyl ether acetate, glycol diacetate, methoxy triglycol acetate, ethyl propionate, propionicacid-n-butyl, propionicacid-i-amyl, diethyl oxalate, oxalicaciddi-n-butyl, lactic acid methyl, ethyl lactate, lacticacid-n-butyl, lacticacid-n-amyl, and diethyl malonate, dimethyl phthalate, and diethyl phthalate; nitrogen-containing solvents such as N-methylformamide, N,N-dimethylformamide, acetamide, N-methylacetamide, N,N-dimethylacetamideN-methylpropionamido, and N-methylpyrrolidone; sulfur-containing solvents such as dimethyl sulfide, diethyl sulfide, thiophene, tetrahydrothiophene, dimethylsulfoxide, sulfolane, and 1,3-propanesultone. These solvent can be used by itself or as a mixture thereof. Moreover, the solvent can be added in an arbitrary process from the beginning of hydrolysis to the coating at one time or separately at multiple stages.

In another aspect, the present invention provides a method for forming a porous film, comprising the steps of: spreading the above-described film-forming composition for forming silica film comprising (A) and (B) on a substrate to form a film; applying a $1^{st}$ thermal processing to the film at temperature adequate to volatilize the solvent in the film; and subsequently applying a $2^{nd}$ thermal processing to the film.

The thickness of the film-forming composition for forming silica film is usually 100 to 1000 nm in case of the interlevel insulating film, and is strictly defined by the circuit design. Any method for spreading the film-forming composition for forming silica film on the substrate which is used in known semiconductor device manufacturing can be performed in the invention, and includes, but not limited to, the spin court method, dipping, and 'paint roller' (called 'roller blade' in Japanese). A substrate in this invention includes, but not limited to, semiconductors, glass, ceramic, and metal.

In the first thermal processing, the removing of solvent is chiefly carried out (this drying process is usually called a pre-bake). The purpose of this process is to cure the shape of the coating film. The desired condition for thermal processing at the first step is 0.5 to 3 minutes at 80 to 200° C. However, this condition depends on the solvent used. When the heating temperature is too low or the heating time is too short, the volatilization of the solvent may not be adequately performed. When the heating temperature is too high or the heating time is too long, the process becomes impractical. The first thermal processing can be usually carried out in ordinarily atmospheric air, however, it can be carried out in the presence of inert gases such as nitrogen and argon, and nitrogen including oxygen.

In the second thermal processing, the polymerization reaction of the film-forming composition for forming silica film is chiefly carried out. 150 to 350° C. for 0.5 to 5 minutes is the desired condition for thermal processing of the second step. When the heating temperature is too low or the heating time is too short, the mechanical strength of the film may be weak. A too high temperature or too long heating time, sometimes do not suit the semiconductor device manufacturing process. It is desirable to carry out a third thermal processing to remove the volatile constituent in silica film. 350 to 450° C. for 30 to 120 minutes is the desired condition for the heating during the third step.

The second and third thermal processing can be performed in atmospheric air, inert gas such as nitrogen and argon, or inert gas including reactive gas such as oxygen and fluorine. Moreover, the multi-step heating process using the combination of these conditions is also effective. The distribution and the mechanical strength of the micro-pore of the film depends on the condition such as atmospheric air and inert gas in which the process is carried out, and the membrane physical property can be controlled by controlling the condition of the process. Moreover, by heating the film-forming composition for forming silica film in the reduced pressure in the formation process of the film of this invention, the influence of oxygen can be excluded, and the dielectric constant of the film can be lowers.

It is desirable to filter the film-forming composition for forming silica film before coating to remove solid impurities. A 0.05 to 0.1 $\mu$m filter is desirable, as productivity maybe decrease remarkably when filters are thinner and the paint film may not be uniform, when filters are thicker.

The thin film obtained by the thermal processing have a large specific surface area. The porous film obtained by the thermal processing having extremely small size pores, and the pore size of the porous is distributed usually within a range of 2 nm or less and rarely distributed in the range of 5 nm or more. This can be confirmed using the BET surface area measurement, which uses gas absorption. Since small micro-pores are uniformly distributed in the film obtained as above, while the ratio of the hole to the entire film is extremely high, the porous film of the present invention can exhibit enormous mechanical strength without lowering the mechanical strength.

The porous film of the present invention is particularly preferable as the interlevel insulator film of the interconnections in a semiconductor integrated circuit. The semiconductor device is required to reduce interconnection capacitance in order to prevent interconnection delay when highly integrated. Various means have been developed to achieve this, and one of them is to reduce the relative permittivity of the interlevel insulator film disposed between metal interconnections.

When an interlevel insulator film is prepared by using the composition for forming a porous film of the present invention, the semiconductor device can be downsized and faster and consume less power.

There is a conventional problem that the porous film which contains pores in the film so as to lower the dielectric constant makes the mechanical strength of the film decrease as the density of the material composing the film decreases. The decrease in mechanical strength not only affects the strength of the semiconductor device itself but also causes exfoliation due to insufficient strength in a chemical mechanical polishing process which is generally used in the fabrication process. Particularly, when used as the interlevel insulator film of a semiconductor, the porous film of the present invention with high mechanical strength and low relative permittivity prevents such exfoliation, thereby greatly improving the reliability of the manufactured semiconductor device.

The embodiments of the semiconductor device of the present invention are described below. FIG. 1 shows an overall cross-sectional view of an embodiment of the semiconductor device of the present invention.

In FIG. 1, the substrate 1 is an Si semiconductor substrate such as an Si substrate or an SOI (Si-on-insulator) substrate; however, it can be a compound semiconductor substrate such as SiGe or GaAs. The semiconductor device include a interlevel insulator film 2 of the contact layer; and the interlevel insulator films 3, 5, 7, 9, 11, 13, 15 and 17 of the interconnection layers. The interconnection layers corresponding to the lowermost interlevel insulator film 3 through the uppermost insulator film 17 are abbreviated as M1, M2, M3, M4, M5, M6, M7 and M8, respectively. The semiconductor device also include the interlevel insulator films 4, 6, 8, 10, 12, 14 and 16 of the via layers. The via layers corresponding to the lowermost interlevel insulator film 4 through the uppermost insulator film 16 are abbreviated as V1, V2, V3, V4, V5, V6 and V7, respectively. Although some of the metal interconnections are referred to with the numbers 18 and 21 to 24, the other regions with the same pattern not labeled with numbers indicate metal interconnections. The via plug 19 is made from a metal. In the case of copper interconnection, copper is generally used. The regions having the same pattern as the via plug 19 represent via plugs although they are not labeled with numbers in the drawing. The contact plug 20 is connected to the gate of the transistor (not illustrated) formed on the top surface of the substrate 1 or to the substrate. Thus, the interconnection layers and the via layers are alternately stacked, and multilayer interconnections generally indicate M1 and regions higher than M1. In general, M1 to M3 are called local interconnections, M4 and M5 are called intermediate interconnections or semi-global interconnections, and M6 to M8 are called global interconnections.

In the semiconductor device of the present invention, the porous film of the present invention is used as one or more of the interlevel insulator films 3, 5, 7, 9, 11, 13, 15, and 17 of the interconnection layers or the insulator films 4, 6, 8, 10, 12, 14, and 16 of the via layers.

For example, when the porous film of the present invention is used for the interlevel insulator film 3 of the interconnection layer (M1), the interconnection capacitance between the metal interconnection 21 and the metal interconnection 22 can be greatly reduced. When the porous film of the present invention is used for the interlevel insulator film 4 of the via layer (V1), the interconnection capacitance between the metal interconnection 23 and the metal interconnection 24 can be greatly reduced. By using the porous film of the present invention, which has a low relative permittivity, as an interconnection layer, the metal interconnection capacitance in the same layer can be greatly reduced. On the other hand, By using the porous film of the present invention, which has a low relative permittivity, as a via layer, the interlevel capacitance between the vertical metal interconnections can be greatly reduced. Therefore, by using the porous film of the present invention for all of the interconnection layers and the via layers, the parasitic capacitance of the interconnections can be greatly reduced. In addition, the use of the porous film of the present invention as insulator films of the interconnections prevents a conventional problem, that is, an increase in the dielectric constant resulting from the porous film absorbing humidity while multilayered interconnections are formed by stacking porous films. Consequently, the semiconductor device can perform high-speed and low-power operations. The porous film of the present invention enables a semiconductor device to have higher mechanical strength by its high mechanical strength, thereby greatly improving the yield of the fabrication and the reliability of the semiconductor device.

EXAMPLES

The following examples concretely explain this invention. However, this invention is not limited to the following examples.

Manufacturing Example 1

The following are added to a 300-ml flask: compound of 3.33 g of tetramethoxy silane and 2.50 g of methyl trimethoxysilane, 100 ml of ethanol solvent, 53.3 g of pure water, and 0.83 g of 25% ammonia water. These were mixed at 60° C. for 3 hours. Next, the ethanol of solvent, and methanol and water generated by hydrolysis were removed by low pressure distillation under the conditions of 60° C. and 40 torr. Propylene glycol propyl ether (PnP) was then added to the residue to obtain a solution of NV8%.

Manufacturing Example 2

12 g of 1,3,5,7-tetramethyl cyclotetrasiloxane (Chemical Formula 1) was dissolved into 30 g of isobutyl alcohol, several drops of the methanol solution of the sodium methylate were added, and the mixture was heated. The solution was heated under reflux for 3 hours as the methanol was removed. Afterwards, specified substance (Formula 2) was obtained through low pressure distillation. The boiling point was 142° C. for 2 hours.

Manufacturing Example 3-6

A cross-linking agent hardening at low temperature was synthesized following the method in Manufacturing Example 2, which corresponds to the siloxane oligomer and alcohols shown in the following Table 1.

TABLE 1

| Manufacturing Example | Siloxane oligomer | Alcohol | Structure |
| --- | --- | --- | --- |
| 2 | Formula 1 | Iso butyl alcohol | Formula 2 |
| 3 | Formula 1 | Tertiary butyl alcohol | Formula 3 |
| 4 | Formula 1 | Iso propyl alcohol | Formula 4 |
| 5 | Formula 5 | Iso butyl alcohol | Formula 6 |
| 6 | Formula 6 | Iso butyl alcohol | Formula 8 |

Formula 1:
$\{CH_3(H)SiO\}_4$
Formula 2:
$\{CH_3(iBuO)SiO\}_4$
Formula 3:
$\{CH_3(tBuO)SiO\}_4$
Formula 4:
$\{CH_3(iPuO)SiO\}_4$ TABLE 1-continued

| Manufacturing Example | Siloxane oligomer | Alcohol | Structure |
| --- | --- | --- | --- |

Formula 5:

[structure diagram of siloxane cage with H substituents]

Formula 6:

[structure diagram of siloxane cage with OiBu substituents]

Formula 7:

[linear siloxane structure with SiMe2 and terminal H groups]

Formula 8:

[linear siloxane structure with SiMe2 and terminal OiBu groups]

Me in the formula indicates $CH_3$, iBu indicates $CH_2CH(CH_3)_2$, tBu indicates $C(CH_3)_3$, and iPu indicates $CH(CH_3)_2$.

Examples and Comparison Examples

The composition was made as shown in Table 2 by adding 0.4 g of the low temperature hardening cross-linking agent to 100 g resin shown in Manufacturing Example 1. The baked membrane was made by filtering the abovementioned composition with a 0.2-$\mu$ filter, spreading the composition on a silicon wafer by spin court method, pre-baking it for 2 minutes at 120° C. to removing the solvent, heating it for 3 minutes at 230° C., and baking it in nitrogen gas stream for 1 hour at 425° C.

The obtained membrane was evaluated. Its membrane thickness was measured with an Ellipsometer. The dielectric constant was measured with a 495CV System mercury probe manufactured by Japan Solid State Measurements Co. (SSM). The hardness and modulus were evaluated with a Toya Technical Nanoindentar SA2 manufactured by MTS Co. The test results are shown in Table 2.

TABLE 2

| | Resin Manufacturing Example | Crosslinking agent | Thickness (Å) | Dielectric constant | Hardness (GPa) | Modulus (GPa) |
|---|---|---|---|---|---|---|
| Example 1 | 1 | 2 | 3342 | 2.11 | 0.52 | 5.8 |
| Example 2 | 1 | 3 | 3463 | 2.12 | 0.53 | 5.5 |
| Example 3 | 1 | 4 | 3426 | 2.15 | 0.50 | 5.4 |
| Example 4 | 1 | 5 | 3385 | 2.13 | 0.52 | 5.8 |
| Example 5 | 1 | 6 | 3289 | 2.12 | 0.51 | 5.7 |
| Comparison 1 | 1 | non | 3517 | 2.12 | 0.32 | 3.4 |

The results also indicate that the present invention brings a porous film having excellent mechanical strength.

What is claimed is:

1. A porous film-forming composition comprising (A) and (B):

(A) 100 parts by weight of at least one hydrolyzable silicon compound or at least one product resulting from at least partial hydrolysis condensation of the silicon compound or both selected from the group consisting of compounds expressed by the following formulae (1) and (2):

$$R^1_a SiZ^1_{4-a} \quad (1)$$

wherein each $Z^1$ denotes independently a hydrolyzable group, and when the compound (1) includes more than one $Z^1$, each $Z^1$ may be identical or different; each $R^1$ denotes independently a substituted or non-substituted monovalent hydrocarbon group, and when the compound (1) includes more than one $R^1$, each $R^1$ may be identical or different; and a is an integer from 0 to 3; and $$R^{21}_b(Z^{21})_{3-b}Si-Y-Si(R^{22})_c Z^{22}_{3-c} \quad (2)$$

wherein $Z^{21}$ and $Z^{22}$ each denotes independently a hydrolyzable group, and when the compound (2) includes more than one $Z^{21}$ or $Z^{22}$ or both each $Z^{21}$ or $Z^{22}$ or both may be identical or different; $R^{21}$ and $R^{22}$ each denotes independently a substituted or non-substituted monovalent hydrocarbon group, and when the compound (2) includes more than one $R^{21}$ or $R^{22}$ or both, each $R^{21}$ or $R^{22}$ or both may be identical or different; each of b and c denotes independently an integer from 0 to 2; and Y is an oxygen atom, a phenylene group, or a divalent hydrocarbon group; and (B) 0.1 to 20 parts by weight of a cross-linking agent comprising at least one cyclic or multiple-branched oligomer which can generate one or more silanol groups by heating and which is selected from the group consisting of oligomers expressed by following formulae (3) to (8), wherein the oligomers:

wherein $R^{31}$ and $R^{32}$ each denotes independently a substituted or non-substituted monovalent hydrocarbon group, and when the compound (3) includes more than one $R^{31}$ or $R^{32}$ or both each $R^{31}$ or $R^{32}$ or both may be identical or different; $Z^3$ denotes independently a group which can generate silanol by heating, and when the compound (3) includes more than one $Z^3$ each $Z^3$ may be identical or different; and each d and e denotes independently an integer from 0 to 10, and a sum of d and e is greater than or equal to three;

$$(R^{41}SiO_{3/2})_f \{R^{42}(H)SiO\}_g \{R^{43}(Z^4)SiO\}_h \quad (4)$$

wherein $R^{41}$, $R^{42}$ and $R^{43}$ each denotes independently a substituted or non-substituted monovalent hydrocarbon group, and when the compound (4) includes more than one $R^{41}$ $R^{42}$ or $R^{43}$ or any combination thereof, each $R^{41}$ $R^{42}$ or $R^{43}$ or any combination thereof may be identical or different; $Z^4$ denotes independently a group which can generate silanol by heating, and when the compound (4) includes more than one $Z^4$ each $Z^4$ may be identical or different; and each f, g and h denotes independently an integer from 0 to 10, a sum of f, g and b is greater than or equal to four, and f is an even number;

$$(HSiO_{3/2})_i (Z^5 SiO_{3/2})_j \quad (5)$$

wherein $Z^5$ denotes independently a group which can generate silanol by heating, and when the compound (5) includes more than one $Z^5$ each $Z^5$ may be identical or different; and each i and j denotes independently an integer from 0 to 10, a sum of i and j is greater than or equal to four, and a sum of i and j is an even number;

$$\{H(CH_3)_2SiO_{1/2}\}_k \{Z^{61}(CH_3)_2SiO_{1/2}\}_m (R^{61}SiO_{3/2})_n \{R^{62}(Z^{62})SiO\}_p \quad (6)$$

wherein $R^{61}$ and $R^{62}$ each denotes independently a substituted or non-substituted monovalent hydrocarbon group, and when the compound (6) includes more than one $R^{61}$ or $R^{62}$ or both, each $R^{61}$ or $R^{62}$ or both may be identical or different; $Z^{61}$ and $Z^{62}$ each denotes independently a group which can generate silanol by heating, and when the compound (6) includes more than one $Z^{61}$ or $Z^{62}$ or both, each $Z^{61}$ or $Z^{62}$ or both may be identical or different; and each k, m, n and p denotes independently an integer from 0 to 20, a sum of k, m, n and p is greater than or equal to five, and a sum of k, m and n is an even number;

$$\{H(CH_3)_2SiO_{1/2}\}_q \{Z^{71}(CH_3)_2SiO_{1/2}\}_r (SiO_2)_s (Z^{72}SiO_{3/2})_t \quad (7)$$

wherein $Z^{71}$ and $Z^{72}$ each denotes independently a group which can generate silanol by heating, and when the compound (7) includes more than one $Z^{71}$ or $Z^{72}$ or both, each $Z^{71}$ or $Z^{72}$ or both may be identical or different; and each q, r, s and t denotes independently an integer from 0 to 20, a sum of q, r, s and t is greater than or equal to four, and a sum of q, r and t is an even numbers; and $$(Z^{81}_3 SiO_{1/2})_u (R^{81}_2 SiO)_v (R^{82}SiO_{3/2})_w \{R^{83}(Z^{82})SiO\}_x (SiO_2)_y (Z^{83}SiO_{3/2})_z \quad (8)$$

wherein $R^{81}$, $R^{82}$ and $R^{83}$ each denotes independently a substituted or non-substituted monovalent hydrocarbon group, and when the compound (8) includes more than one $R^{81}$, $R^{82}$ or $R^{83}$ or any combination thereof, each $R^{81}$, $R^{82}$ or $R^{83}$ or any combination thereof may be identical or different; each $Z^{81}$, $Z^{82}$ and $Z^{83}$ denotes independently a group which can generate silanol by heating, and when the compound (8) includes more than one $Z^{81}$, $Z^{82}$ or $Z^{83}$ or any combination thereof, each $Z^{81}$, $Z^{82}$ or $Z^{83}$ or any combination thereof may be identical or different; and each u, v, w, x, y and z denotes independently an integer from 0 to 20, a sum of u, v, w, x, y and z is greater than or equal to three, and a sum of u, w and z is an even number.

2. The film-forming composition according to claim 1, further comprising organic solvent.

3. The film-forming composition according to claim 1, wherein said oligomer has a group which can generate said one or more silanol groups by heating and which has a decomposition temperature of 350° C. or less.

4. The film-forming composition according to claim 1, wherein said oligomer has a group which can generate one or more silanol groups by heating and which is a secondary alkoxy group or a tertiary alkoxy group.

5. A method for forming a porous film, comprising the steps of:
applying the composition according to claim 1 to a substrate to form a film thereon;
applying a 1$^{st}$ thermal processing to the film at temperature adequate to volatilize the solvent in the film; and
subsequently applying a 2$^{nd}$ thermal processing to the film.

6. A porous film comprising the porous film-forming composition according to claim 1.

7. An interlevel insulating film comprising the porous film-forming composition according to claim 1.

8. A semiconductor device comprising an internal porous film comprising a porous film-forming composition comprising (A) and (B):

(A) 100 parts by weight of at least one hydrolyzable silicon compound or at least one product resulting from at least partial hydrolysis condensation of the silicon compound or both selected from the group consisting of compounds expressed by the following formulae (1) and (2):

$$R^1_a SiZ^1_{4-a} \quad (1)$$

wherein $Z^1$ denotes independently a hydrolyzable group, and when the compound (1) includes more than one $Z^1$, each $Z^1$ may be identical or different; $R^1$ denotes independently a substituted or non-substituted monovalent hydrocarbon group, and when the compound (1) includes more than one $R^1$, each $R^1$ may be identical or different; and a is an integer from 0 to 3; and $$R^{21}_b(Z^{21})_{3-b}Si-Y-Si(R^{22})_c Z^{22}_{3-c} \quad (2)$$

wherein $Z^{21}$ and $Z^{22}$ each denotes independently a hydrolyzable group, and when the compound (2) includes more than one $Z^{21}$ or $Z^{22}$, or both, each the $Z^{21}$ or $Z^{22}$ or both may be identical or different; $R^{21}$ and $R^{22}$ each denotes independently a substituted or non-substituted monovalent hydrocarbon group, and when the compound (2) includes more than one $R^{21}$ or $R^{22}$, or both, each the $R^{21}$ or $R^{22}$ or both may be identical or different; each of b and c denotes independently an integer from 0 to 2; and Y is an oxygen atom, a phenylene group, or a divalent hydrocarbon group; and (B) 0.1 to 20 parts by weight of a cross-linking agent comprising at least one cyclic or multiple-branched oligomer which can generate one or more silanol groups by heating and which is selected from the group consisting of oligomers expressed by the following formulae (3) to (8), wherein the oligomers:

$$\{R^{31}(H)SiO\}_d\{R^{32}(Z^3)SiO\}_e \quad (3)$$

wherein $R^{31}$ and $R^{32}$ each denotes independently a substituted or non-substituted monovalent hydrocarbon group, and when the compound (3) includes more than one $R^{31}$ or $R^{32}$, or both, each $R^{31}$ or $R^{32}$ or both may be identical or different; $Z^3$ denotes independently a group which can generate silanol by heating, and when the compound (3) includes more than one $Z^3$, each $Z^3$ may be identical or different; and each d and e denotes independently an integer from 0 to 10, and a sum of d and e is greater than or equal to three;

$$(R^{41}SiO_{3/2})_f\{R^{42}(H)SiO\}_g\{R^{43}(Z^4)SiO\}_h \quad (4)$$

wherein $R^{41}$, $R^{42}$ and $R^{43}$ each denotes independently a substituted or non-substituted monovalent hydrocarbon group, and when the compound (4) includes more than one $R^{41}$, $R^{42}$ or $R^{43}$ or any combination thereof, each $R^{41}$, $R^{42}$ or $R^{43}$ or any combination thereof may be identical or different; $Z^4$ denotes independently a group which can generate silanol by heating, and when the compound (4) includes more than one $Z^4$, each $Z^4$ may be identical or different; and each f, g and h denotes independently an integer from 0 to 10, a sum of f, g and b is greater than or equal to four, and f is an even number;

$$(HSiO_{3/2})_i(Z^5SiO_{3/2})_j \quad (5)$$

wherein $Z^5$ denotes independently a group which can generate silanol by heating, and when the compound (5) includes more than one $Z^5$, each $Z^5$ may be identical or different; and each i and j denotes independently an integer from 0 to 10, a sum of i and j is greater than or equal to four, and a sum of i and j is an even number;

$$\{H(CH_3)_2SiO_{1/2}\}_k\{Z^{61}(CH_3)_2SiO_{1/2}\}_m(R^{61}SiO_{3/2})_n\{R^{62}(Z^{62})SiO\}_p \quad (6)$$

wherein $R^{61}$ and $R^{62}$ each denotes independently a substituted or non-substituted monovalent hydrocarbon group, and when the compound (6) includes more than one $R^{61}$ or $R^{62}$, or both, each $R^{61}$ or $R^{62}$ or both may be identical or different; $Z^{61}$ and $Z^{62}$ each denotes independently a group which can generate silanol by heating, and when the compound (6) includes more than one $Z^{61}$ or $Z^{62}$, or both, each $Z^{61}$ or $Z^{62}$ or both may be identical or different; and each k, m, n and p denotes independently an integer from 0 to 20, a sum of k, m, n and p is greater than or equal to five, and a sum of k, m and n is an even number;

$$\{H(CH_3)_2SiO_{1/2}\}_q\{Z^{71}(CH_3)_2SiO_{1/2}\}_r(SiO_2)_s(Z^{72}SiO_{3/2})_t \quad (7)$$

wherein $Z^{71}$ and $Z^{72}$ each denotes independently a group which can generate silanol by heating, and when the compound (7) includes more than one $Z^{71}$ or $Z^{72}$, or both, each $Z^{71}$ or $Z^{72}$ or both may be identical or different; and each q, r, s and t denotes independently an integer from 0 to 20, a sum of q, r, s and t is greater than or equal to four, and a sum of q, r and t is an even numbers; and $$(Z^{81}_3SiO_{1/2})_u(R^{81}_2SiO)_v(R^{82}SiO_{3/2})_w\{R^{83}(Z^{82})SiO\}_x(SiO_2)_y(Z^{83}SiO_{3/2})_z \quad (8)$$

wherein $R^{81}$, $R^{82}$ and $R^{83}$ each denotes independently a substituted or non-substituted monovalent hydrocarbon group, and when the compound (8) includes more than one $R^{81}$, $R^{82}$ or $R^{83}$ or any combination thereof, each $R^{81}$, $R^{82}$ or $R^{83}$ or any combination thereof may be identical or different; each $Z^{81}$, $Z^{82}$ and $Z^{83}$ denotes independently a group which can generate silanol by heating, and when the compound (8) includes more than one $Z^{81}$, $Z^{82}$ or $Z^{83}$ or any combination thereof, each $Z^{81}$, $Z^{82}$ or $Z^{83}$ or any combination thereof may be identical or different; and each u, v, w, x, y and z denotes independently an integer from 0 to 20, a sum of u, v, w, x, y and z is greater than or equal to three, and a sum of u, w and z is an even number.

9. The semiconductor device according to claim 8, wherein the porous film-forming composition further comprises organic solvent.

10. The semiconductor device according to claim 8, wherein said oligomer has a group which can generate said one or more silanol groups by heating and which has a decomposition temperature of 350° C. or less.

11. The semiconductor device according to claim 8, wherein said oligomer has a group which can generate one or more sulanol groups by heating and which is a secondary alkoxy group or a tertiary alkoxy group.

12. The semiconductor device according to claim 8, wherein said porous film is between metal interconnections in a same layer of multi-level interconnects, or is between vertical upper and lower metal interconnection layers.

* * * * *

UNITED STATES PATENT AND TRADEMARK OFFICE
CERTIFICATE OF CORRECTION

PATENT NO. : 6,930,393 B2  Page 1 of 1
APPLICATION NO. : 10/807494
DATED : August 16, 2005
INVENTOR(S) : Hamada et al.

It is certified that error appears in the above-identified patent and that said Letters Patent is hereby corrected as shown below:

Column 19,
Line 17, "composilion" should read --composition--;
Line 39, "both each" should read --both, each--;
Line 43, "$R^{21\ or\ R22}$" should read --$R^{21}$ or $R^{22}$--;
Line 52, after "wherein the oligomers:" insert --$\{R^{31}(H)SiO\}_d\{R^{32}(Z^3)SiO\}_e$ (3)--;
Line 59, after "$Z^3$", first occurrence, insert --,--;
Line 66, "$R^{41}\ R^{42}$", both occurrences, should read --$R^{41}$, $R^{42}$--.

Column 20,
Line 3, "$Z^4$", first occurrence, should read --$Z^4$,--;
Line 12, "$Z^5$", first occurrence, should read --$Z^5$,--.

Column 21,
Line 40, "each the $R^{21}$" should read --each $R^{21}$--.

Column 22,
Line 60, "sulanol" should read --silanol--.

Signed and Sealed this

Second Day of January, 2007

JON W. DUDAS
*Director of the United States Patent and Trademark Office*